US006766938B2

(12) United States Patent
Cheng et al.

(10) Patent No.: US 6,766,938 B2
(45) Date of Patent: Jul. 27, 2004

(54) APPARATUS AND METHOD OF PLACING SOLDER BALLS ONTO A SUBSTRATE

(75) Inventors: Chi Wah Cheng, Kwai Chung (CN); Ping Chun Chong, Kwai Chung (CN); Chi Fung Chan, Kwai Chung (CN); Chin Pang Chan, Kwai Chung (CN)

(73) Assignee: ASM Assembly Automation Ltd. (HK)

( * ) Notice: Subject to any disclaimer, the term of this patent is extended or adjusted under 35 U.S.C. 154(b) by 7 days.

(21) Appl. No.: 10/042,829

(22) Filed: Jan. 8, 2002

(65) Prior Publication Data

US 2003/0127501 A1 Jul. 10, 2003

(51) Int. Cl.[7] .............................................. B23K 31/02
(52) U.S. Cl. ........................................ 228/41; 228/246
(58) Field of Search ......................... 228/180.22, 245, 228/246, 41

(56) References Cited

U.S. PATENT DOCUMENTS

| 5,655,704 | A | * | 8/1997 | Sakemi et al. ............... 228/246 |
| 5,839,641 | A | * | 11/1998 | Teng ........................... 228/41 |
| 5,918,792 | A |   | 7/1999 | Stumpe et al. |
| 6,182,356 | B1 | * | 2/2001 | Bolde ........................... 29/821 |
| 6,229,210 | B1 |   | 5/2001 | Casey |
| 6,253,992 | B1 | * | 7/2001 | Fjelstad ....................... 228/245 |
| 6,268,275 | B1 | * | 7/2001 | Cobbley et al. .............. 438/612 |
| 6,270,002 | B1 | * | 8/2001 | Hayashi et al. .............. 228/246 |
| 6,390,351 | B1 | * | 5/2002 | Kasai et al. .................. 228/41 |
| 6,413,850 | B1 | * | 7/2002 | Ooroku et al. ............... 438/613 |
| 6,551,917 | B2 | * | 4/2003 | Cobbley et al. .............. 438/613 |
| 2001/0041437 | A1 | * | 11/2001 | Cobbley et al. |
| 2002/0058406 | A1 | * | 5/2002 | Mukuno et al. |
| 2002/0139730 | A1 | * | 10/2002 | Itou et al. |

FOREIGN PATENT DOCUMENTS

| EP | 0902610 A1 | * | 3/1999 |
| JP | 408139440 A | * | 5/1996 |
| WO | 0054921 |   | 9/2000 |

* cited by examiner

Primary Examiner—Kiley Stoner
(74) Attorney, Agent, or Firm—Ostrolenk, Faber, Gerb & Soffen, LLP

(57) ABSTRACT

The invention provides an apparatus and method for positioning solder balls in a desired array on a substrate. A positioning means is provided for positioning the solder balls in positions corresponding to the array of positions the solder balls are to take up on the substrate. A container for receiving a plurality of solder balls and which is movable between a first position remote from the positioning means and a second position directly thereover supplies solder balls to the positioning means. Means are provided to bias the solder balls in the direction of movement of the container from the first to the second position whereby to reduce or obviate damage to the solder balls during such movement.

13 Claims, 9 Drawing Sheets

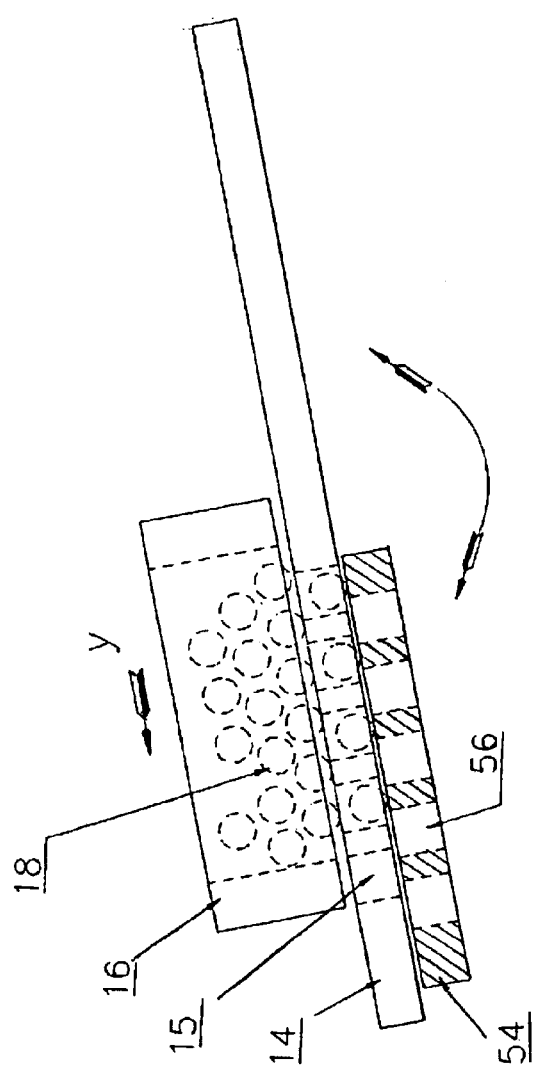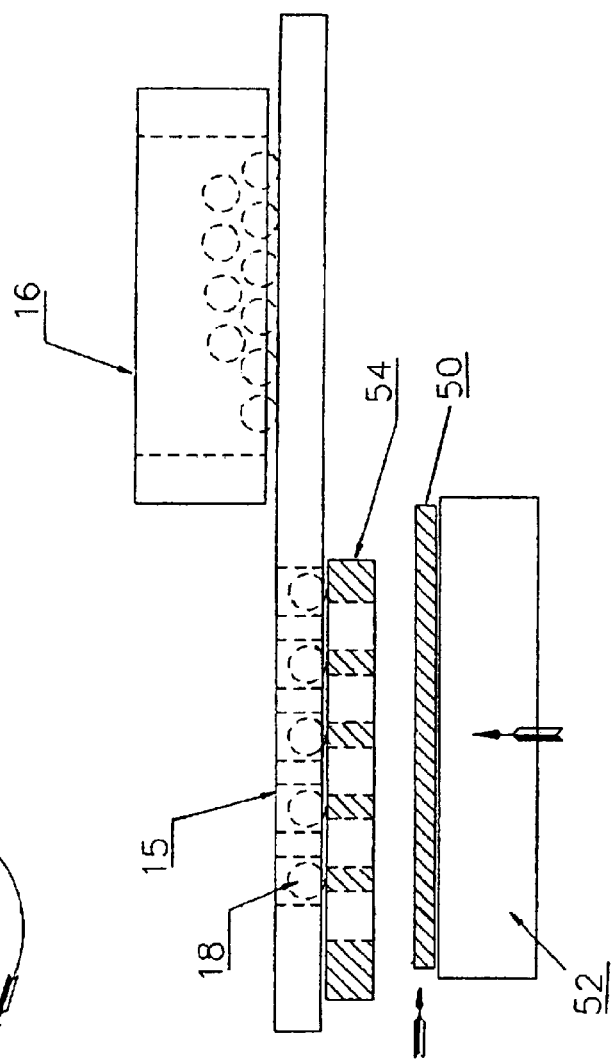

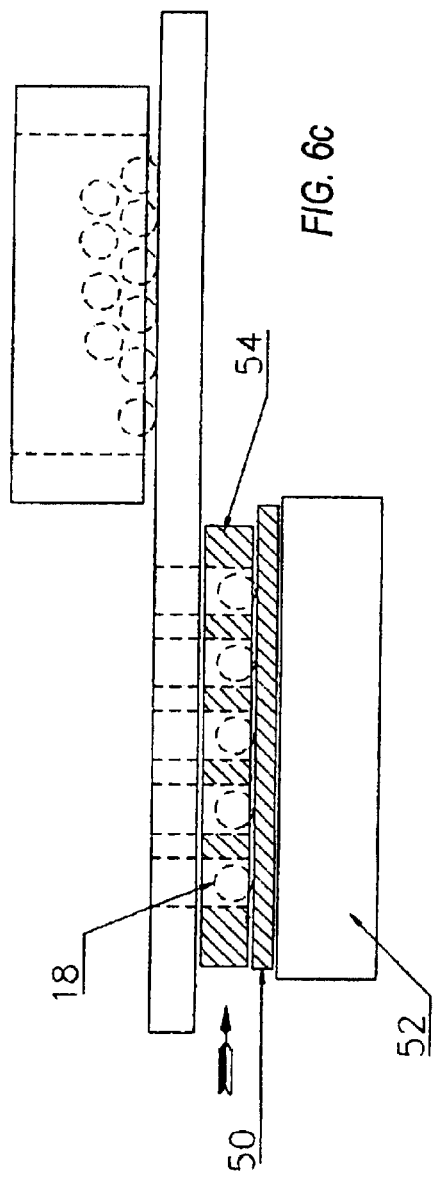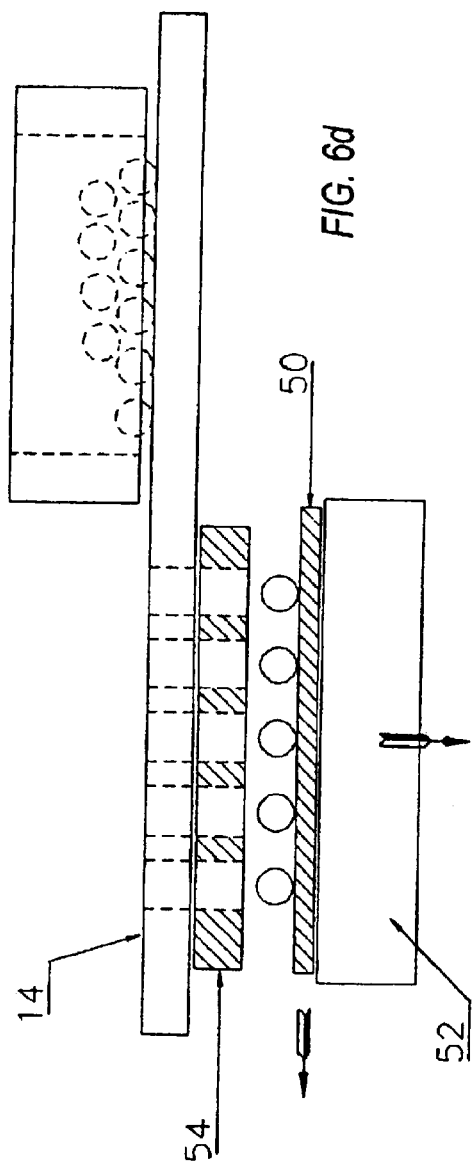

APPARATUS AND METHOD OF PLACING SOLDER BALLS ONTO A SUBSTRATE

FIELD OF THE INVENTION

The present invention relates to an apparatus and method for automatically placing an array of solder balls onto a substrate, such as a ball-grid array (BGA) substrate.

BACKGROUND AND PRIOR ART

The use of BGA packages as semiconductor integrated circuits is becoming more popular and common. One method of manufacturing BGA packages is to firmly attach solder balls to solder pads (or electrodes) found on a BGA substrate such that electrical conductivity is maintained between electrical connections manufactured on the BGA substrate and external devices with corresponding electronic circuits. Such a manufacturing process typically involves solder ball placement and solder ball reflow. The former involves locating the positions of the solder pads and placing the solder balls onto these positions, and the latter is a process in which solder balls melt, wet and reflow onto the solder pads of the BGA substrate to create the electrical conductivity.

Current systems for solder ball placement usually apply "sweeping" and "gravity rolling" concepts to locate and place the solder balls onto the solder pads. Several examples from the prior art will illustrate the concept of sweeping.

U.S. Pat. No. 5,655,704 for a "Method and Apparatus for Mounting Soldering Balls onto Electrodes of a Substrate or a Comparable Electronic Component" describes a ball-filling device using a "sweeping" concept. The ball-filling device include a container which has a supply of solder balls, which fill up apertures of a ball-receiving element when the container is moved over the area of the apertures. Due to the storage of a large number of solder balls in the container, significant forces are generated due to the weight of the plurality of solder balls which are exerted on one another, and these forces act to restrain the solder balls from falling freely under the influence of gravity into the apertures. In addition, there is a high risk that solder balls that are partially engaged in empty apertures are sheared by the edges of the container as the container is moved over the apertures.

Another example of a ball-filling device is described in PCT publication number 00/564921 for a "Filling Device and Method for Filling Balls in the Apertures of a Ball-Receiving Element". It comprises housing including an opening at a lower surface thereof and defining in part a chamber for containing a supply of balls. The housing is movably disposed over an array of apertures, and distribution means disposed within the housing distributes balls contained in the chamber so that limited number of layers of the balls are spread over the apertures. Although the described device alleviates the problem of shearing of solder balls during filling of the solder pads as compared to the prior art, the soft solder balls can still be damaged by the distribution means, which in itself, has edges and produces undesired forces on the solder balls that can cause damage.

Another example of the use of these concepts is U.S. Pat. No. 6,229,210 which describes a "Device and method for attaching and soldering pre-formed solder spheres to the BGA integrated circuit package attachment sites in high volume." In this design, the placement device comprises a pre-formed stencil having a pattern of through holes corresponding to contact pads of a BGA substrate. By brushing the solder balls or by the use of a U-shaped blade, the balls are made to fall into the apertures. The problem is that since the solder balls are exposed to the atmosphere, they can be oxidized more easily and contamination may easily occur from the surroundings and/or the blade. Furthermore, the soft solder balls may be damaged by the blade.

As another example, U.S. Pat. No. 5,918,792 describes an "Apparatus and method for filling a ball grid array". A ball-filling device comprises a solder bin that is moved along side rails over a stencil allowing solder balls to fill apertures in the stencil and thereby settling on corresponding solder pads, before being fixed by adhesive. As explained above, the problem is that solder balls may be damaged by the edges of the side walls of the solder bin and also by the edges of the many apertures.

SUMMARY OF THE INVENTION

It Is an objective of the present Invention to provide an improved apparatus for automated placement of solder balls onto a substrate, so that damage and/or oxidation of solder balls are reduced as compared to the prior art.

According to a first aspect of the invention there is provided an apparatus for positioning solder balls in a desired array on a substrate comprising a positioning means for positioning the solder balls in positions corresponding to the array of positions the solder balls are to take up on the substrate, a container for receiving a plurality of solder balls and which is movable between a first position remote from the positioning means and a second position directly thereover, and means to bias the solder balls in the direction of movement of the container from the first to the second position whereby to reduce or obviate damage to the solder balls during such movement.

According to a second aspect of the invention there is provided a method for positioning solder balls in a desired array on a substrate, comprising providing positioning means for positioning the solder balls in positions corresponding to the array of positions the solder balls are to take up on a substrate, providing a container for receiving a plurality of solder balls, providing means to move the container between a first position remote from the positioning means and a second position directly thereover, and providing means to bias the solder balls to move in the direction of movement of the container whereby damage to the solder balls is reduced or obviated.

According to a third aspect of the invention there is provided a substrate on which a plurality of solder balls so arranged in a desired array according to an apparatus or a method as hereinbefore defined.

Using the invention it is possible to provide an apparatus and method in which a force, usually gravitational force, will be provided which is independent of the force generated on the solder balls by the walls of the container during said movement whereby to bias the solder balls In the direction of movement of the container.

It will be convenient to hereafter describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

FIGS. 6a to 6d show the application of the design to a third preferred embodiment of the invention wherein solder balls fill the apertures of a ball template and then fall onto solder pads of a BGA substrate by gravity.

DETAILED DESCRIPTION OF THE PREFERRED EMBODIMENTS OF THE INVENTION

Figure 1:
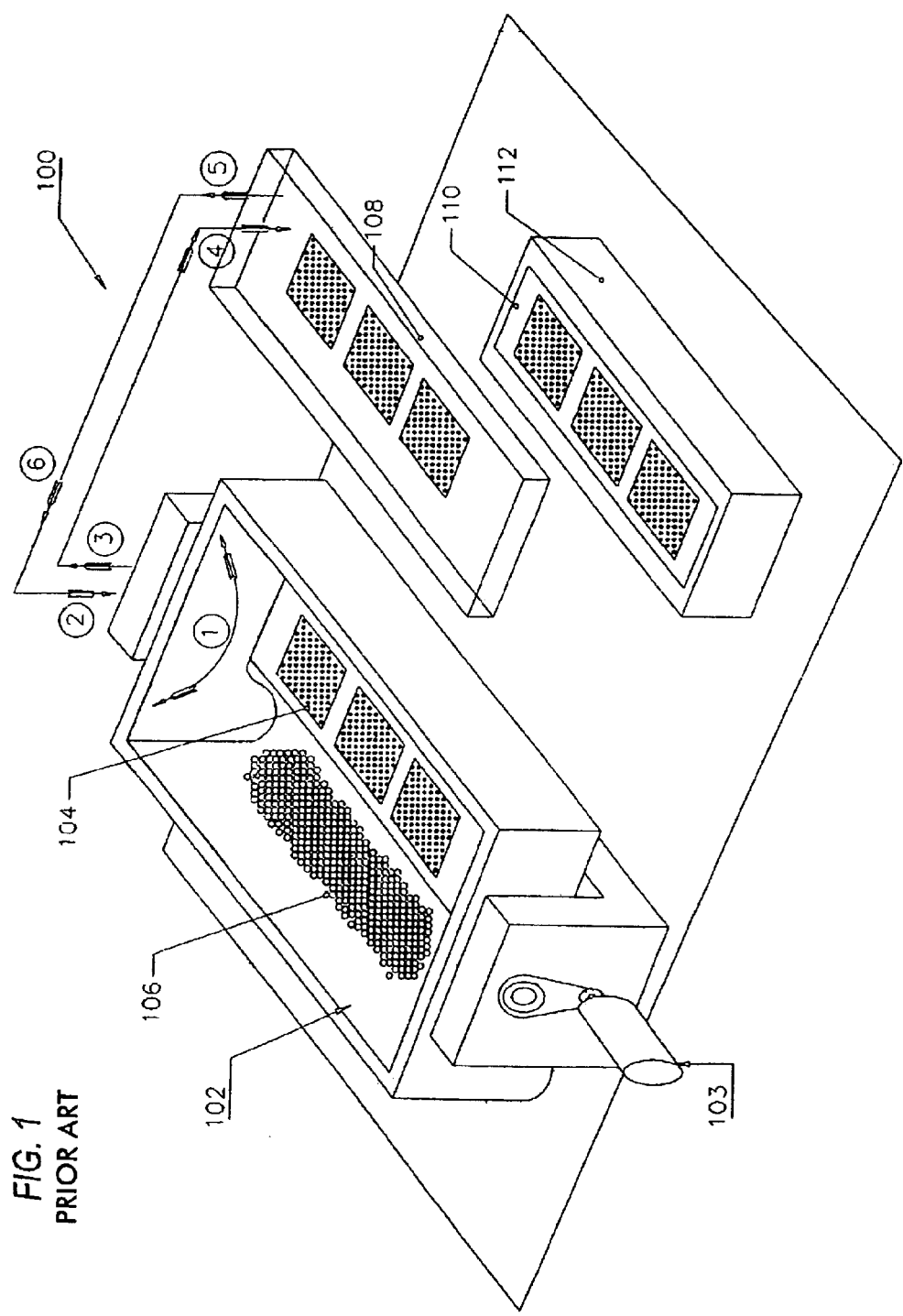
FIG. 1 illustrates an example of a ball-filling device of the prior art.

FIG. 1 illustrates an example or a ball-filling device 100 according to prior art U.S. Pat. No. 6,276,698. The prior art device 100 includes a ball carrier container 102 in which a number of solder balls 106 are storable. The ball carrier container 102 is capable of swinging or rotational movement in direction "1" along the long axis of the ball carrier container 102 illustrated in FIG. 1 This rotational movement may be achieved by using a handle 103 that is operatively connected to the ball carrier container 102 in use.

The ball carrier container 102 includes a ball template 104 comprising a number of apertures, each having a diameter slightly larger than the diameter of each solder ball 106, thus allowing solder balls 106 to fall into the apertures. With the said rotational movement, solder balls 106 are spread over the area of the ball template 104 so that they are allowed to fall into the apertures, filling the apertures. The arrangement of apertures on the ball template 104 correspond to the arrangement of solder pads on a BGA substrate 110. Once the apertures of the ball template 104 are filled by solder balls 106, a vacuum head 108 is placed in direction "5", "6", "2" over the ball template 104 which has suction means to suck the solder balls 106 onto the vacuum head 108. The vacuum head 108 is then moved to a position above the BGA substrate 110 carried on a BGA holder 112, in the direction "3", "4" Illustrated In FIG. 1, so that the solder balls 106 are aligned with the positions of the solder pads on the BGA substrate. Once aligned, the suction means is switched off and the solder balls 106 are released onto the BGA substrate, which is then processed.

Figure 2B:
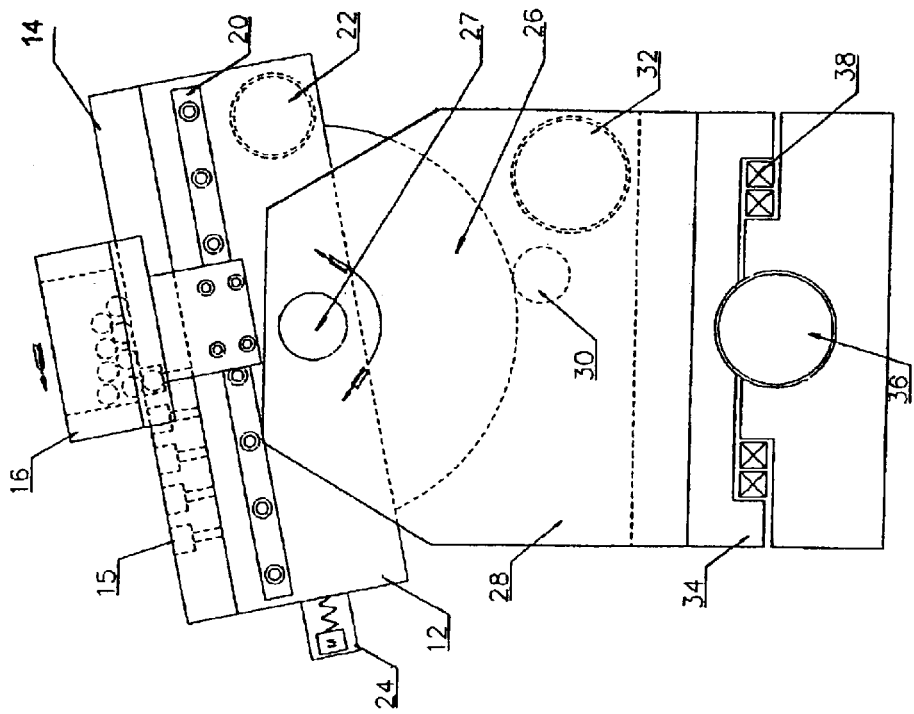
FIGS. 2a and 2b show a ball-filling device according to a preferred embodiment of the invention.
Figure 2A:
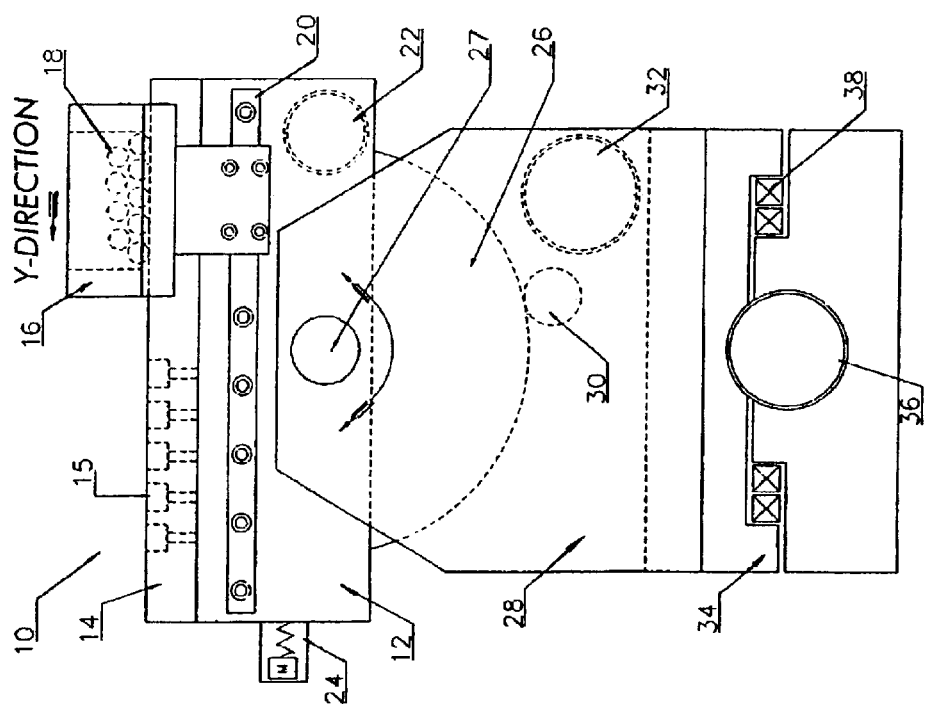

FIGS. 2a and 2b show a ball-filling device 10 according to a preferred embodiment of the invention. Referring to FIG. 2a, the ball-filling device 10 includes a base 12, on which is mounted a positioning means, such as a ball template 14 having an array of apertures 15 arranged in the same order as the pattern of solder pads on a BGA substrate 60 (see, for example, FIG. 5). The apertures 15 have diameters which are slightly larger than the diameter of the solder balls 18, preferably about 10% larger. A container, also referred to herein as a ball sweeper 16, carries a supply of solder balls 18. The ball sweeper 16 is preferably open at its bottom so that the solder balls 18 rest directly onto the ball template 14. However, the top of the ball sweeper 16 is preferably enclosed so that the solder balls 18 are isolated from direct contact with the surrounding atmosphere so that the problem of oxidation of the solder balls 18 as well as contamination may be reduced.

The ball sweeper 16 is supported and guided by a linear guide 20 mounted adjacent to the base 12. A y-motor 22 exerts a horizontal force on the portion of the ball sweeper 16 linked to the linear guide 20 to enable the ball sweeper 16 to slide along the linear guide 20 relative to the apertures 15. A vibrator 24 is preferably included to assist in spreading the solder balls 18, as explained below.

Beneath the base 12, there is a curved surface 26 that cooperates with a gear system 30 on a base support 28 to provide rotational motion of the base 12 relative to the base support 28 about an axis perpendicular to the plane of the paper, and thus perpendicular to the y-directional motion of the ball sweeper 16. The base 12 is pivotally connected to the base support at a pivot point 27. The gear system 30 is driven by a theta-motor 32. The base support 28 rests on an x-table that is guided by a linear guide 38 for movement in the x-direction, that is, perpendicular to the plane of the paper. The motion of the x-table 34 is driven by an x-motor 36 With the above arrangement, it would be appreciated that the ball sweeper 16 is movable in the x-, y- and rotational directions.

FIG. 2b shows the base 12 being displaced at an angle with respect to the base support 28 as compared to FIG. 2a. This is caused by the movement of the gear system 30, which causes counter-clockwise rotation of the curved surface 26 and therefore the base 12. The ball sweeper 16 is also tilted at an angle. A gravitational force independent of the force generated on the solder balls 18 by the sides or end walls of the ball sweeper 16 when in motion is created so that the solder balls 18 accumulate on one side of the ball sweeper 16 towards the y-direction motion of the ball sweeper 16. As a result, damage to solder balls 18 caused as a result of the sliding movement of the right side of the ball sweeper 16 along the ball template 14 reduced or obviated.

Figure 3A:
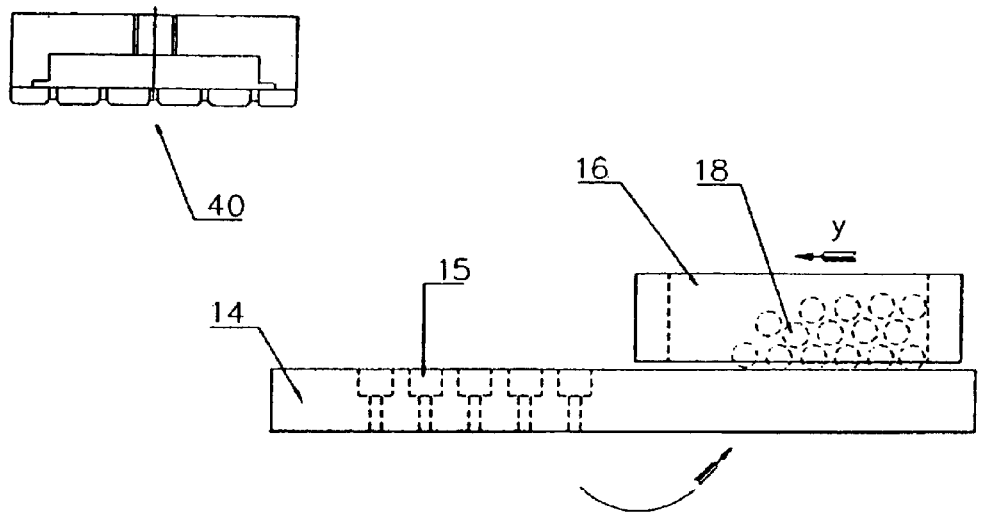
FIGS. 3a to 3d show the ball-filling and ball pick-up operation sequences namely the ball-filling, ball pick-up and standby positions.

FIGS. 3a to 3d show the ball-filling and ball pick-up operation sequences, namely the ball-filling, ball pick-up and standby positions. Referring to FIG. 3a, the ball sweeper 16 is moved in the y-direction from a first position towards the array of apertures 15. Due to inertia, the solder balls 18 would tend to accumulate at the right side of the ball sweeper 16, and are pushed in the y-direction only by the right-hand side of the ball sweeper 16. Thus, because of the softness of the solder balls 18, the bottom edges of the ball sweeper 16 may cut and damage the solder balls 18. FIG. 3a also shows a pick head 40 that is used with this embodiment to transfer solder balls 18 from the ball template 14 to a BGA substrate 50.

Figure 3B:
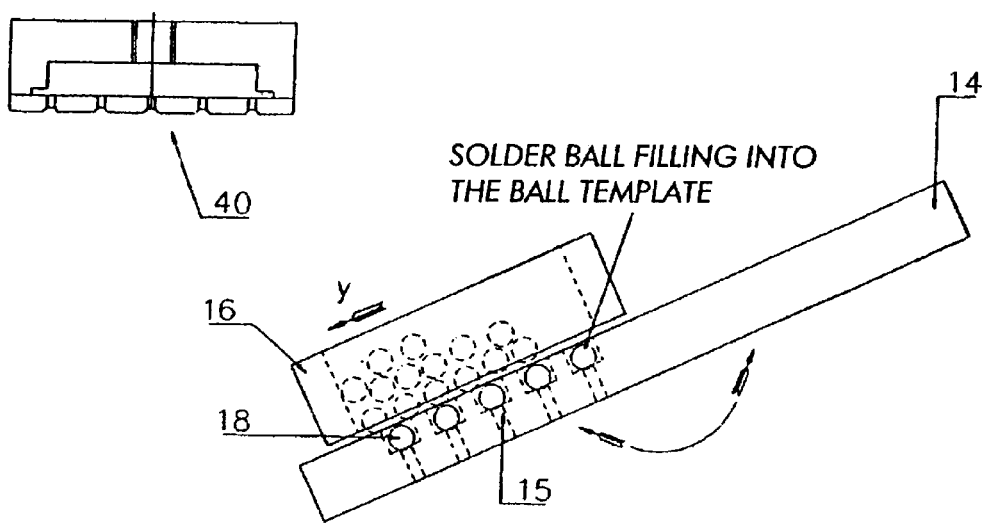

FIG. 3b illustrates the ball template 14 being tilted counter-clockwise while the ball sweeper 16 connects to move in the y-direction. As a consequence, the solder balls 18 also move in the y-direction due to the shifting of their weight relative to the inclined surface of the ball template 14. Therefore, this avoids the problem of the right-hand edges of the ball sweeper 16 cutting and damaging the solder balls 18. As the solder balls travel over the apertures 15, to a second position directly thereover, solder balls 18 will fall into apertures 15 that are empty, thereby filling up all the apertures 15 with solder balls 18.

It should be noted that when the ball sweeper 16 covers the array of apertures 15, the ball template 14 may be rotated clockwise and counter-clockwise a pre-determined number of times up to the illustrated angles of inclination while the ball sweeper 16 is stationary so that the solder balls 18 slide or roll over the whole array of apertures 10 within the boundaries of the ball sweeper 16.

This results in the solder balls 18 more efficiently and effectively filling the array of apertures 15.

Figure 3C:
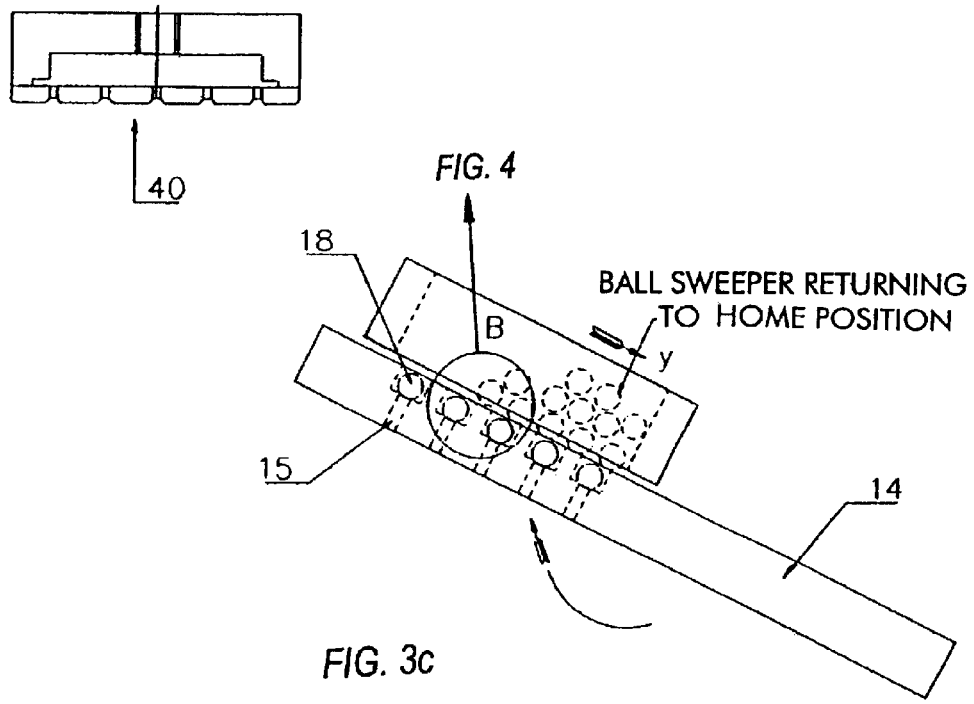

FIG. 3c illustrates the ball sweeper 16 being moved back to its starting position to the right of the ball template 14 after the apertures 15 have been filled. Simultaneous with this motion the ball template 14 is rotated clockwise so that as the ball sweeper 16 travels in the -y direction, the solder balls 18 will tend to follow the direction of travel of the ball sweeper 16 by virtue of their own weight. Damage to the solder balls 18 from the edges on the left-hand side of the ball sweeper 16 is thus avoided.

To further ensure that balls are not damaged during the filling operation, it is preferable that the vibrator 24 is activated at the time of moving the ball sweeper 16 in each direction and/or when the ball sweeper 16 is over the apertures 15 so that vibration is generated on the solder balls 18 and ball template 14. This assists the solder balls 18 which are in contact with the upper surface of the ball template 14 and the solder balls 18 which are already in the apertures 15, to separate from one another. Thus, the chance of damaging solder balls 18 is further reduced. If there are some apertures 15 not filled with solder balls 18 at this time, the apertures 15 can be further filled when the ball sweeper 16 conducts another filling operation wherein the operation can be further optimized by selecting an appropriate returning rotating speed and y-motion speed.

Figure 3D:
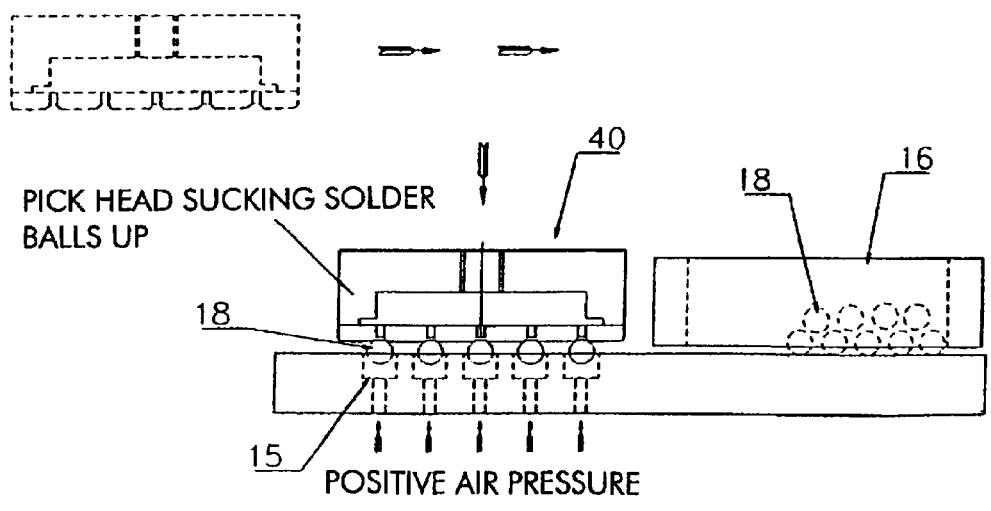

FIG. 3d illustrates the ball sweeper 16 having moved back to its starting position. At this time, the ball template 14 is rotated back to the horizontal position. The pick head 40 is moved over the array of solder balls 18, and suction means associated with the pick head 40 adhere the patterned solder balls 18 to the pick head 40. Advantageously, positive air pressure is applied from cavities under the solder balls 18 to assist in adhering them to the pick head 40. The pick head 40 is then moved to a location of a BGA substrate 50 and the solder balls 16 are released over the corresponding solder pads of the BGA substrate.

Figure 4:
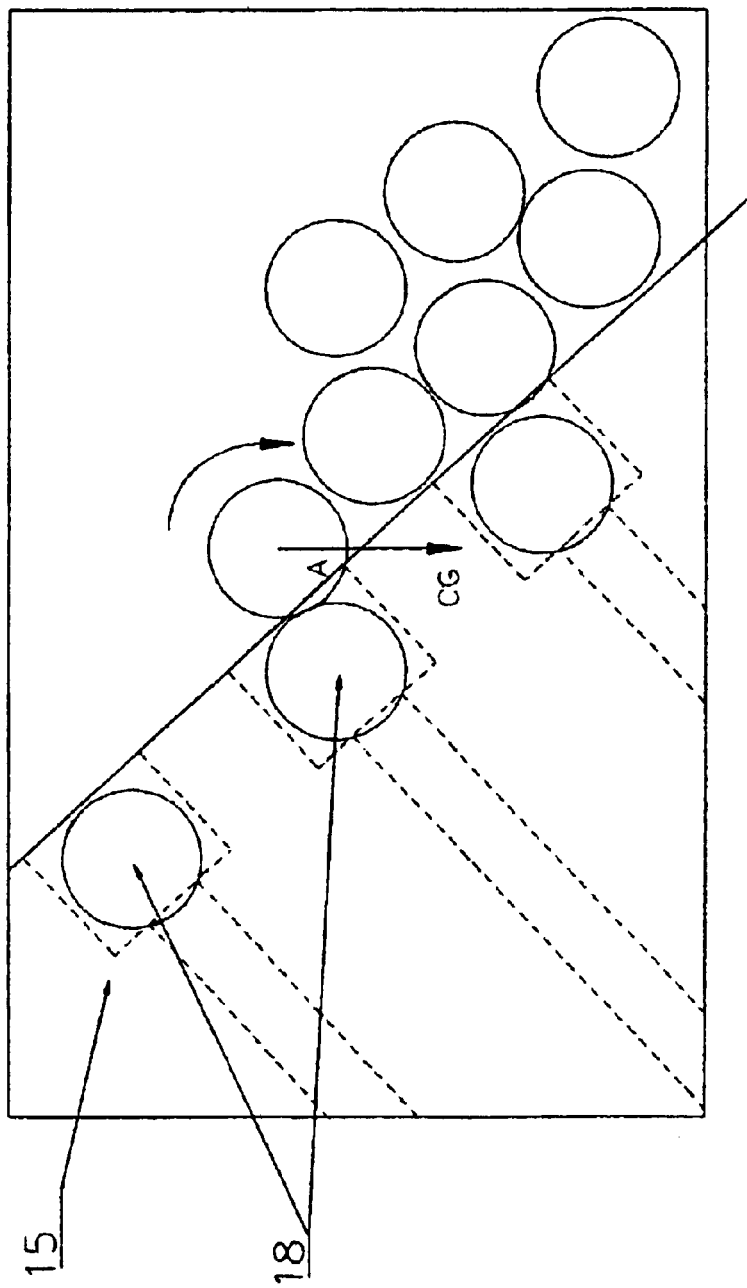
FIG. 4 is a magnified view of the area marked as "B" in FIG. 3c illustrating the way in which an appropriate tilting angle assists a solder ball to separate from other solder balls that have been located in the apertures of the ball-filling device.

FIG. 4 is a magnified view of the area marked as "B" in FIG. 3c illustrating the way in which an appropriate tilting angle assists a solder ball 18 to separate from other solder balls that have been located in the apertures 15 of the ball-filling device 10. As the direction of the center of gravity of each solder ball 18 is at an angle to the surface of the ball template 14, and points towards the downward side of point A (being the point of contact between the solder ball 18 and the edge of the aperture 15), a horizontal component of this center of gravity causes the solder balls 18 to roll towards the appropriate -y direction and overcome this edge at point A smoothly. This avoids shearing of the solder balls 18 by the edge of the rear wall of the ball sweeper 16 and the edges of the apertures 15.

FIGS. 5a to 5f show another preferred embodiment of the invention wherein solder balls 18 fall directly onto pads of A BGA substrate 50 by force of gravity. As the operation of the design is largely the same as that described in relation to FIGS. 3a to 3d, details of the design will be omitted wherever they are unnecessarily repetitive.

Figure 5A:
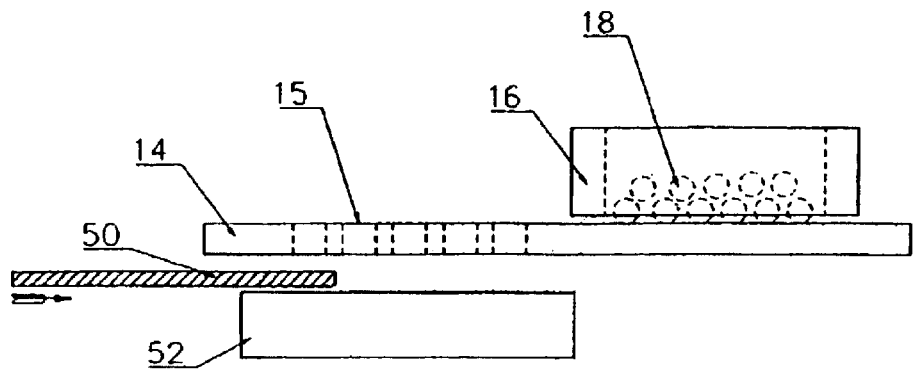
FIGS. 5a to 5f show the application of the design to another preferred embodiment of the invention wherein solder balls fall directly onto pads of a BGA substrate by force of gravity.
Figure 5B:
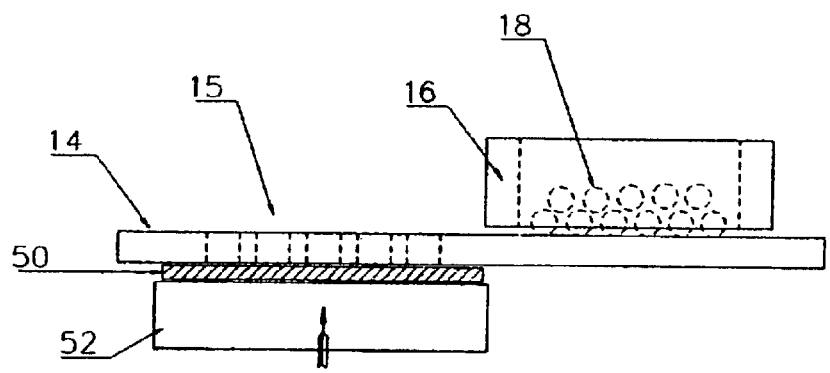

FIG. 5a shows a BGA substrate 50 being placed onto a substrate holder 52, which is located underneath a ball template 14 with an array of apertures 15 as previously described. However, the apertures 15 comprise throughholes such that a solder ball 18 will fall right through an aperture 15 rather than be held within it. In FIG. 5b, after the BGA substrate 50 is placed onto the substrate holder 52, the substrate holder 52 is raised such that the BGA substrate 50 is in close proximity to the ball template 14. Naturally, the positions of the apertures 16 correspond to the positions of the solder pads of the BGA substrate 50.

Figure 5C:
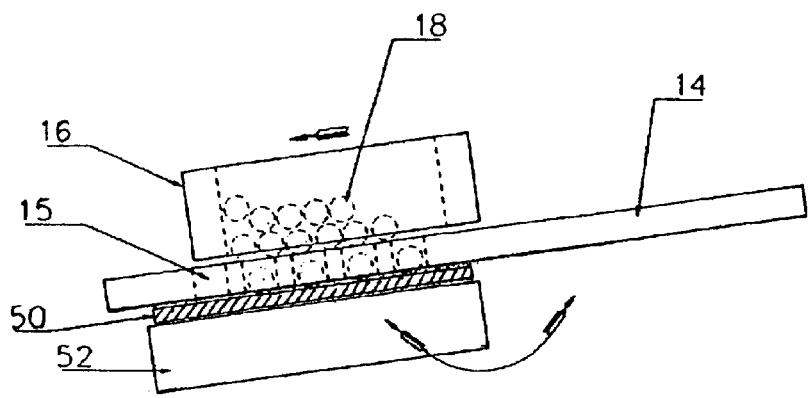
Figure 5D:
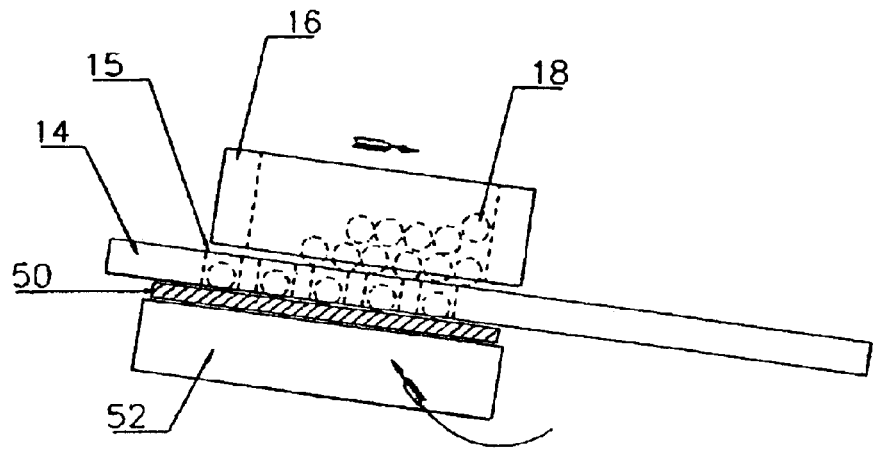

In FIG. 5c, the ball sweeper 16 is moved in the y-direction while the ball template 14, along with the BGA substrate 50 and substrate holder 52, are tilted counter-clockwise. Solder balls 18 fall into the apertures 15 of the ball template 14 as they spread over the apertures 15. Since the apertures 15 allow the solder balls 18 to fall right through, the solder balls 18 will rest on the BGA substrate 50. In FIG. 5d, the ball template 14, BGA substrate 50 and substrate holder 52 are tilted In the clockwise direction while the ball sweeper 16 is moved in the -y direction to allow the remaining solder balls 18 to move towards the -y direction whilst the ball sweeper 16 returns to its starting position.

Figure 5E:
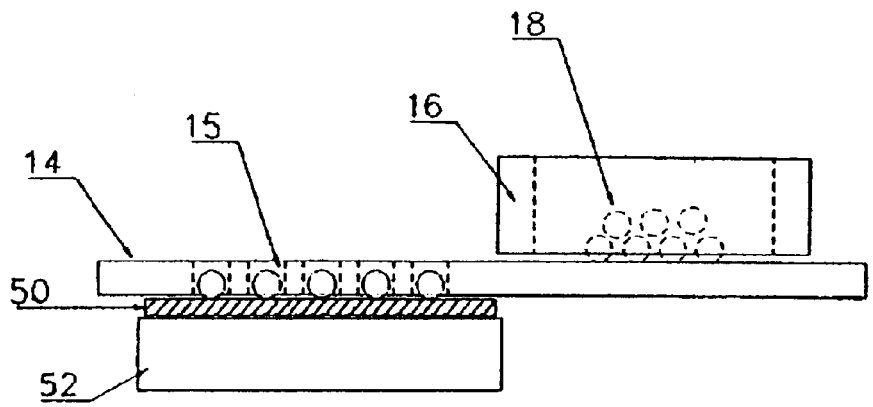
Figure 5F:
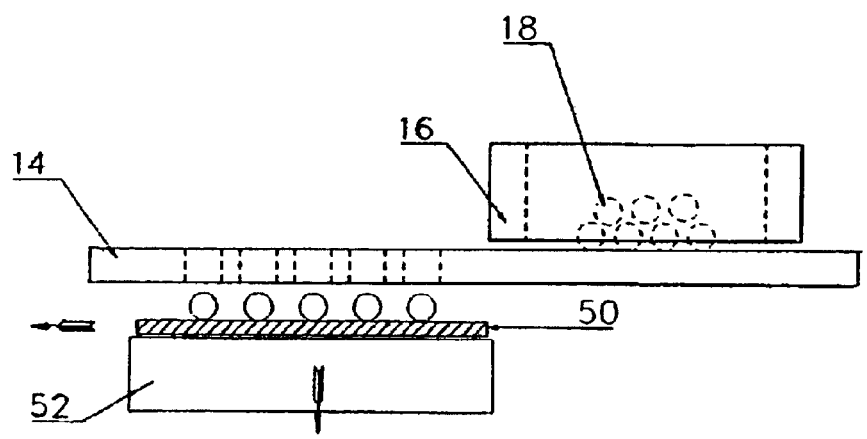

In FIG. 5e, the ball sweeper 16 is in the starting position, and the ball template 14. BGA substrate 50 and substrate holder 52 are horizontal. All the apertures 15 have been filled with solder balls 18. The substrate holder 52 may then be lowered and the BGA substrate 50 with the solder balls 18 placed in the appropriate positions may then be removed as in FIG. 5f for further processing. The cycle may then be repeated with another BGA substrate.

FIGS. 6a to 6d show a third preferred embodiment of the invention wherein solder balls 18 fill the apertures of a ball template 14 and then fall onto solder pads of a BGA substrate 50 by gravity. In this embodiment, the BGA substrate 50 is not rotated together with the ball template 14.

FIG. 6a shows a ball template 14 with an array of aperture 15. A separator such Us a sliding plate 54 with a similarly-arranged array of apertures 56 is placed under the ball template 14. However, the apertures 15 of the ball template 14 are placed at a half-pad pitch offset from the apertures 56 of the sliding plate 54 at this stage, such that the fall of the solder balls 18 will be arrested by the sliding plate 54. In this case, the ball sweeper 16 is moved in the y-direction as the ball template 14 and sliding plate 54 are tilted counter-clockwise. Solder balls 18 are spread and fall into the apertures 15 of the ball template 14.

The ball template 14 and sliding plate 54 will then be tilted in the clockwise direction as the ball sweeper 16 is moved back to its starting position. FIG. 6b shows the ball template 14 and sliding plate 54 horizontal when the ball sweeper 16 is back at its starting position. A BGA substrate 50 is placed on a substrate holder 52, and the substrate holder 52 is raised so that tile BGA substrate 50 is just below the sliding plate 54. At this point, the solder pads on the BGA substrate 50 are aligned with the apertures 15 on the ball template 14 but out of alignment with the apertures 56 of the sliding plate 54.

In FIG. 6c, the sliding plate 54 is shifted by half-pad pitch so that the apertures 15 of the ball template 14, apertures 56 of the sliding plate 54 and solder pads on the BGA substrate 50 arc aligned. As a result, the solder balls 18 in the apertures 15 of the ball template 14 fall through the sliding plate 54 onto the BGA substrate 50. A vibrator (not shown) can also be activated in this embodiment to assist in this operation to allow the solder balls 18 to fall through more efficiently.

As shown in FIG. 6d, the substrate holder 52 can now be lowered away from the sliding plate 54 and the BGA substrate 50 with the solder balls 18 placed into position can be removed for further processing.

Accordingly, it should be appreciated that the invention helps to avoid the problem of ball damage during ball filling. By isolating the ball sweeper 16 from the surrounding atmosphere, the problems of solder ball oxidation and contamination can be avoided. The ball filling operation is also more reliable and the chance of missing solder balls 18 occurring during the placement onto a BGA substrate 50 is reduced. This is due to the ability to optimize the ball filling operation by controlling the number of rotating cycles dad magnitude of rotation when the ball sweeper 16 covers the array of apertures 15. A further opportunity of filling missing balls is also provided during the return motion of the ball sweeper 16 to Its original position by optimizing return rotating speed and return linear motion speed.

The invention described herein is susceptible to variations, modifications and/or additions other than those specifically described and it is to be understood that the invention includes all such variations, modifications and/or additions which fall within the spirit and scope of the above description.

What is claim is:

1. An apparatus for positioning solder balls in a desired array on a substrate, comprising:
   a positioning member which is constructed and configured to direct the solder balls to required positions corresponding to the array of positions the solder balls are to take up on the substrate;
   a container for a plurality of solder balls, the container being configured and operable to move in a first direction from, a first end position remote from die positioning member to a second end position directly in communication with the positioning member to provide wider balls to the positioning member, and to move in a second direction opposite to the first direction from the second end position to the first end position to move the solder bails not in required positions away from the positioning member; and
   a mechanism constructed and configured to apply a force to the solder balls in the container in the direction of movement of the container as the container moves between the first position and the second position.

2. An apparatus according to claim 1, wherein the mechanism to apply a force to the solder balls comprises a tilting mechanism adapted to rotate the container about an axis perpendicular to the direction of motion of the container and thereby tilt it.

3. An apparatus according to claim 2, wherein the container and positioning member are rotatable a plurality of times when the container is in position directly over the positioning member, so that the solder balls are repeatedly spread over the positioning member.

4. An apparatus according to claim 2, wherein rotational angles of the container and/or the moving speed of the container are controllable to optimize the efficiency of the apparatus.

5. An apparatus according to claim 3, wherein there is a positioning rail and motor whereby the container is positioned and driven.

6. An apparatus according to claim 1, which includes a vibration-generating device to facilitate the separation of solder balls from surfaces they are in contact with and/or from one another.

7. An apparatus according to claim 1, wherein the positioning member includes a ball template with a plurality of apertures each slightly larger than the size of a solder ball in order to capture solder balls within the ball template, and wherein the plurality of apertures are arranged in an order similar to the array of positions comprising solder pads on the substrate.

8. An apparatus according to claim 6, wherein solder balls captured in the plurality of apertures are removable by a pick-and-place device while retaining their respective positions, and placed onto corresponding positions of solder pads on the substrate.

9. An apparatus according to claim 6, which includes mans means to rotate the container, ball template and substrate simultaneously.

10. An apparatus according to claim 6, wherein the apertures comprise through-holes which allow solder balls to fail through the ball template directly onto a substrate placed below it.

11. An apparatus according to claim 6, wherein there is a separator capable of separating the ball template from the substrate in use, and the separator is movable from a first position where passage of solder balls from the ball template onto the substrate is prevented and a second position where passage of the solder balls from the ball template onto the substrate is permitted.

12. An apparatus according to claim 1, wherein the container is closed at the top to reduce oxidation of the solder balls and open at the bottom for direct entry of the balls to the positioning member substantially throughout the bottom of the container.

13. An apparatus according to claim 7, wherein the plurality of apertures are located substantially toward one end of the positioning member whereby the container is in communication with the apertures on the positioning member only while the container is in the vicinity of the second end position.

\* \* \* \* \*